(12) United States Patent
Sukata

(10) Patent No.: US 9,862,866 B2
(45) Date of Patent: Jan. 9, 2018

(54) ELECTRICALLY CONDUCTIVE ADHESIVE COMPOSITION, CONNECTION STRUCTURE, SOLAR BATTERY MODULE, AND METHOD FOR PRODUCING SAME

(71) Applicant: HITACHI CHEMICAL COMPANY, LTD., Tokyo (JP)

(72) Inventor: Shinichirou Sukata, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 85 days.

(21) Appl. No.: 14/640,493

(22) Filed: Mar. 6, 2015

(65) Prior Publication Data

US 2015/0255633 A1    Sep. 10, 2015

(30) Foreign Application Priority Data

Mar. 10, 2014   (JP) ................................ 2014-046744

(51) Int. Cl.
| | |
|---|---|
| H01L 31/02 | (2006.01) |
| H01L 31/18 | (2006.01) |
| C09J 163/00 | (2006.01) |
| H01L 31/048 | (2014.01) |
| C09J 9/02 | (2006.01) |
| C08G 59/68 | (2006.01) |
| H01L 31/0224 | (2006.01) |
| H01L 31/05 | (2014.01) |

(52) U.S. Cl.
CPC ............ *C09J 163/00* (2013.01); *C08G 59/68* (2013.01); *C09J 9/02* (2013.01); *H01L 31/022425* (2013.01); *H01L 31/048* (2013.01); *H01L 31/0504* (2013.01); *Y02E 10/50* (2013.01)

(58) Field of Classification Search
CPC ............ B23K 35/0244; B23K 35/3612; B23K 35/3618; H05K 1/0393; H05K 1/095; H05K 1/0213; H05K 1/118; H05K 1/0323; H05K 1/22; H01L 31/0516; H01L 31/0512; H01L 31/05
USPC .......................................... 136/244
See application file for complete search history.

(56) References Cited

U.S. PATENT DOCUMENTS

| | | | | |
|---|---|---|---|---|
| 5,476,553 A | * | 12/1995 | Hanoka ............. | B32B 17/10036 136/251 |
| 2015/0008022 A1 | * | 1/2015 | Masui ...................... | H01B 1/22 174/257 |
| 2015/0325731 A1 | * | 11/2015 | Namjoshi ........... | H01L 31/0516 136/244 |

FOREIGN PATENT DOCUMENTS

| | | |
|---|---|---|
| JP | 2000-501551 A | 2/2000 |
| JP | 2002-097439 A | 4/2002 |
| JP | 2002-263880 A | 9/2002 |
| JP | 2004-204256 A | 7/2004 |
| JP | 2005-243935 A | 9/2005 |
| JP | 2007-238751 A | 9/2007 |
| JP | 2013-229314 A | 11/2013 |
| WO | 2009/020005 A1 | 2/2009 |

(Continued)

OTHER PUBLICATIONS

Office Action of counterpart JP Patent Application No. P2014-046744 dated Nov. 7, 2017.

*Primary Examiner* — Jayne Mershon
(74) *Attorney, Agent, or Firm* — Fitch, Even, Tabin & Flannery, LLP

(57) ABSTRACT

An electrically conductive adhesive composition comprising electrically conductive particles containing a metal of which (Continued)

melting point is 220° C. or less, a thermosetting resin, and a thermal cationic polymerization initiator.

17 Claims, 4 Drawing Sheets

(56) References Cited

FOREIGN PATENT DOCUMENTS

| | | |
|---|---|---|
| WO | 2011/046176 A1 | 4/2011 |
| WO | 2012/102077 A1 | 8/2012 |
| WO | 2012/141200 A1 | 10/2012 |
| WO | 2013/020767 A1 | 2/2013 |
| WO | 2013/021895 A1 | 2/2013 |
| WO | WO 2013/125517 * | 8/2013 |

* cited by examiner

Fig.3
(a)
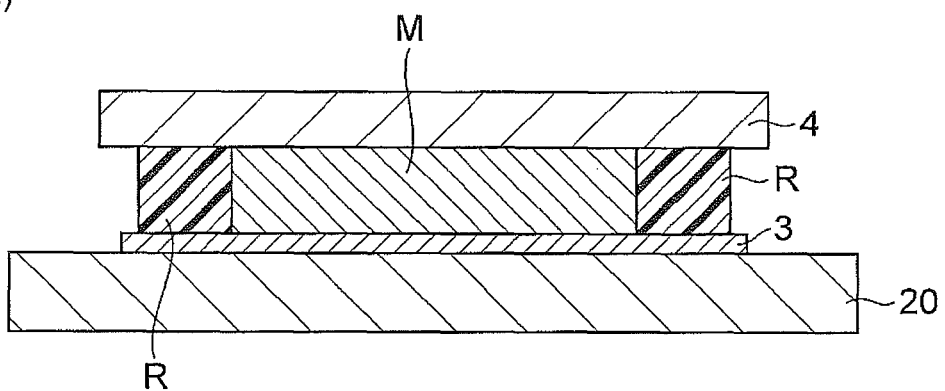
(b)
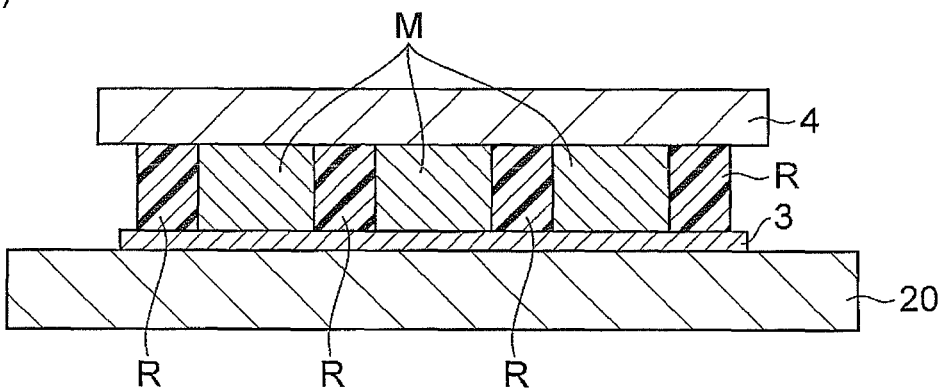

Fig.4
| EVALUATION RESULTS | A | B | C |
|---|---|---|---|
| X-RAY FLUOROSCOPIC APPARATUS IMAGE |  | 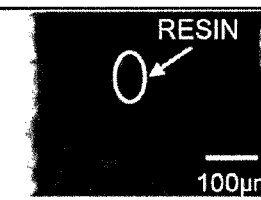 | 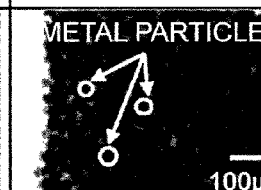 |
| CONDITION OF METAL | COMPLETE MELT, INTEGRATION | MELT (WITH RESIN ENGAGEMENT) | METAL PARTICLES |

ELECTRICALLY CONDUCTIVE ADHESIVE COMPOSITION, CONNECTION STRUCTURE, SOLAR BATTERY MODULE, AND METHOD FOR PRODUCING SAME

BACKGROUND OF THE INVENTION

Field of the Invention

The present invention relates to an electrically conductive adhesive composition, a connection structure, a solar battery module, and a method for producing the same. The present invention particularly relates to an electrically conductive adhesive composition used for electrically connecting the electrode of a solar battery cell and a wiring member, a connection structure and a solar battery module obtained by using the electrically conductive adhesive composition, and a method for producing the solar battery module.

Related Background Art

As means for solving serious global warming and fossil energy depletion, attention is paid on solar batteries, which are power generating systems using sunlight. In a current mainstream solar battery, solar battery cells having an electrode formed on a monocrystalline or polycrystalline silicon (Si) wafer are used, and a structure obtained by connecting a plurality of the solar battery cells in series or in parallel to each other via a metal wiring member has been employed.

Usually, solder, which exhibits good electrical conductivity and is relatively inexpensive, has been used for connection of the electrode of a solar battery cell and a wiring member (for example, see Japanese Patent Application Laid-Open No. 2002-263880). Furthermore, recently, in consideration of environmental problems, a method has been known in which, after covering copper wire as a wiring member with Sn—Ag—Cu solder which does not contain Pb, the solder is heated to its melting temperature or more to thereby connect the electrode of a solar battery cell and the wiring member (for example, see Japanese Patent Application Laid-Open Nos. 2002-263880 and 2004-204256).

However, when the electrode of the solar battery cell and the wiring member are connected using the Sn—Ag—Cu solder, it is necessary to perform heating at temperatures of 260° C. or more, which exceeds the melting point of the Sn—Ag—Cu solder. This brings a problem of the occurrence of degradation in the properties of the solar battery cell, and further brings a problem of a reduction in the yield because of the occurrence of warp or cracks in the solar battery cell.

In particular, in a case where the above-described solder-coated wiring member is used for connection of an electrode of a heterojunction solar battery cell, whose solar battery properties are known to be significantly reduced by heating to 200° C. or more, there has been a problem of the occurrence of degradation in the properties of the solar battery cell, and also a problem in which the handleability during production is significantly reduced because peeling and destruction of the electrode on the cell occur by a reduction in the connection strength caused due to degradation of the electrode on the solar battery cell.

Additionally, this reduction in the connection strength caused due to degradation of the electrode on the cell is an issue which is not limited to heterojunction solar batteries but is common to a solar battery cell in which the strength of the electrode itself on the cell or the strength of the interface between the electrode and the cell is weak.

For such connection of the electrode of the solar battery cell and the wiring member, use of an electrically conductive adhesive composition has been suggested (see, for example, Japanese Patent Application Laid-Open No. 2005-243935). The conductive adhesive composition is a composition in which metal particles (silver particles and the like) are mixed or dispersed in a thermosetting resin, and primarily the metal particles come in physical contact with the electrode of the solar battery cell and the wiring member to develop an electrical connection

SUMMARY OF THE INVENTION

However, since the electrical conductivity developing mechanism of the electrically conductive adhesive composition described in Japanese Patent Application Laid-Open No. 2005-243935 and the like is based on the contact among metal particles, sufficient connection properties are not necessarily obtained, and the connection properties tends to decrease after a high-temperature and high-humidity test (for example, at 85° C./85%).

An example of a method for producing a common solar battery module is the following method. First, after a flux activator is applied on the electrode surface of a solar battery cell, the electrode surface of the solar battery cell and a wiring member are arranged so as to face each other to laminated them, and then, the resulting laminate is subjected to hot air heating to manufacture a connection structure of the solar battery cell and the wiring member (referred to as a "solar battery string"). Then, after encapsulants are laminated on both sides of the solar battery string, a glass member is laminated on the encapsulant at the light receiving surface side of the solar battery cell and also a protective film is laminated on the encapsulant at the back surface side (the surface opposite to the light receiving surface) of the solar battery cell to manufacture a laminate, and further, the laminate is thermally encapsulated by using a vacuum laminator.

In the hot air heating step during manufacturing of this solar battery string, since a high heating temperature and a long heating time will be the direct cause of the degradation in the properties of the solar battery cell and the reduction in the yield caused due to warp or cracks in the solar battery cell, a heating connection at a low temperature and in a short time is required. In particular, as for a solar battery cell in which the strength of the electrode itself on the cell or the strength of the interface between the electrode and the cell is weak, an extreme reduction in the connection strength due to heat stress on the wiring connection portion is observed even under heating at a low temperature and in a short time, and the reduction in the handleability and in the yield due to peeling of the wiring is significant.

It is thus an object of the present invention to provide an electrically conductive adhesive composition with which good connection strength is obtained in a connection under the conditions of low-temperature and short-time and good connection reliability is obtained in a high-temperature and high-humidity test. It is also an object of the present invention to provide a connection structure and a solar battery module obtained by using such an electrically conductive adhesive composition, and a method for producing the solar battery module.

The electrically conductive adhesive composition according to the present invention comprises electrically conductive particles containing a metal of which melting point is 220° C. or less, a thermosetting resin, and a thermal cationic polymerization initiator.

With the electrically conductive adhesive composition according to the present invention, it is possible to cure a thermosetting resin to an extent that good connection strength is provided in low-temperature and short-time heating by using a thermal cationic polymerization initiator. Further, with the electrically conductive adhesive composition according to the present invention, a surface oxide film on the electrically conductive particles and a surface oxide film on the connection portion in contact with the electrically conductive particles are removed by an acid liberated from the thermal cationic polymerization initiator in low-temperature and short-time heating. Thereby, melting and aggregation of the electrically conductive particles are promoted, and also sufficient wettability for the connecting portion is developed. Thus, since formation of an electrically conductive path is enabled, it is possible to obtain good electrical properties. Accordingly, with the electrically conductive adhesive composition according to the present invention, it is possible to combine good connection strength and electric properties, good connection strength is obtained in a connection under the conditions of low-temperature and short-time (for example, a short-time connection at a temperature lower than the melting point of Sn—Ag—Cu solder), and good connection reliability is obtained in a high-temperature and high-humidity test (for example, 85° C./85%).

It is preferable that the content of the electrically conductive particles be from 5 to 95% by mass relative to the total amount of the electrically conductive adhesive composition.

It is preferable that the aforementioned metal of the electrically conductive particles contains at least one selected from the group consisting of bismuth, indium, tin, and zinc.

The electrically conductive adhesive composition according to the present invention may further comprise a flux activator. It is preferable that the flux activator have a hydroxyl group and a carboxyl group.

It is preferable that the thermosetting resin contain an epoxy resin.

It is preferable that the thermal cationic polymerization initiator release at least one selected from the group consisting of an inorganic ion containing an antimony atom, an inorganic acid ion containing a phosphorus atom, and an organic acid ion containing a boron atom, by heating.

It is preferable that the reaction start temperature of the thermosetting resin and the thermal cationic polymerization initiator be from 30 to 200° C.

The electrically conductive adhesive composition according to the present invention may be used to electrically connect the electrode of a solar battery cell and a wiring member.

The connection structure according to the present invention comprises a solar battery cell, and a wiring member electrically connected with the electrode of the solar battery cell via the aforementioned electrically conductive adhesive composition or its cured product.

The method for producing a solar battery module according to the present invention comprises a step of arranging the electrode of a solar battery cell and a wiring member so as to face each other via the aforementioned electrically conductive adhesive composition, a step of laminating encapsulants on the light receiving surface side of the solar battery cell and on the back surface side opposite to the light receiving surface, a step of laminating a glass member on the encapsulant at the light receiving surface side of the solar battery cell, a step of laminating a protective film on the encapsulant at the back surface side of the solar battery cell, and a step of heating the laminate having the aforementioned glass member and the aforementioned protective film to electrically connect the electrode of the solar battery cell and the wiring member and also to encapsulate the solar battery cell.

The solar battery module according to the present invention comprises a solar battery cell, a wiring member electrically connected to the electrode of the solar battery cell via the aforementioned electrically conductive adhesive composition or its cured product, encapsulants laminated each on the light receiving surface side of the solar battery cell and the back surface side opposite to the light receiving surface, a glass member laminated on the encapsulant at the light receiving surface side of the solar battery cell, and a protective film laminated on the encapsulant at the back surface side of the solar battery cell.

According to the present invention, good connection strength is obtained in a connection under the conditions of low-temperature and short-time, and good connection reliability is obtained in a high-temperature and high-humidity test. In the present invention like this, a connection at temperatures lower than the melting point of Sn—Ag—Cu solder (for example, 220° C. or less) is enabled, good connection strength is obtained after the connection of the wiring by low-temperature and short-time heating, and it is possible to prevent the electrical conductivity from decreasing after exposure in a high-temperature and high-humidity test (for example, 85° C./85%).

According to the present invention, in the wiring connection process of the step of producing a solar battery module, a connection with low-temperature and short-time heating is enabled, good connection strength is obtained even in a solar battery cell in which the strength of the electrode itself on the cell or the strength of the interface between the electrode and the cell is weak, and it is possible to improve the yield by enhancement in the handleability.

According to the present invention, it is possible to provide the use of an electrically conductive adhesive composition for solar batteries. According to the present invention, it is possible to provide the use of an electrically conductive adhesive composition for the connection of the electrode of a solar battery cell and a wiring member. According to the present invention, it is possible to provide the use of an electrically conductive adhesive composition for heterojunction solar batteries (HIT (registered trademark) solar batteries). According to the present invention, it is possible to provide the use of an electrically conductive adhesive composition for crystalline silicon solar batteries. According to the present invention, it is possible to provide the use of an electrically conductive adhesive composition for the back-surface electrode type (back contact type) solar battery cells.

BRIEF DESCRIPTION OF THE DRAWINGS

FIG. 3 is a schematic cross sectional view showing a connection portion between a solar battery cell and a wiring member; and FIG. 4 is a view showing the result of an aggregation condition of the metal in the electrically conductive adhesive between a surface electrode and a wiring member observed with an X-ray fluoroscopic apparatus.

DESCRIPTION OF THE PREFERRED EMBODIMENTS

Figure 1:
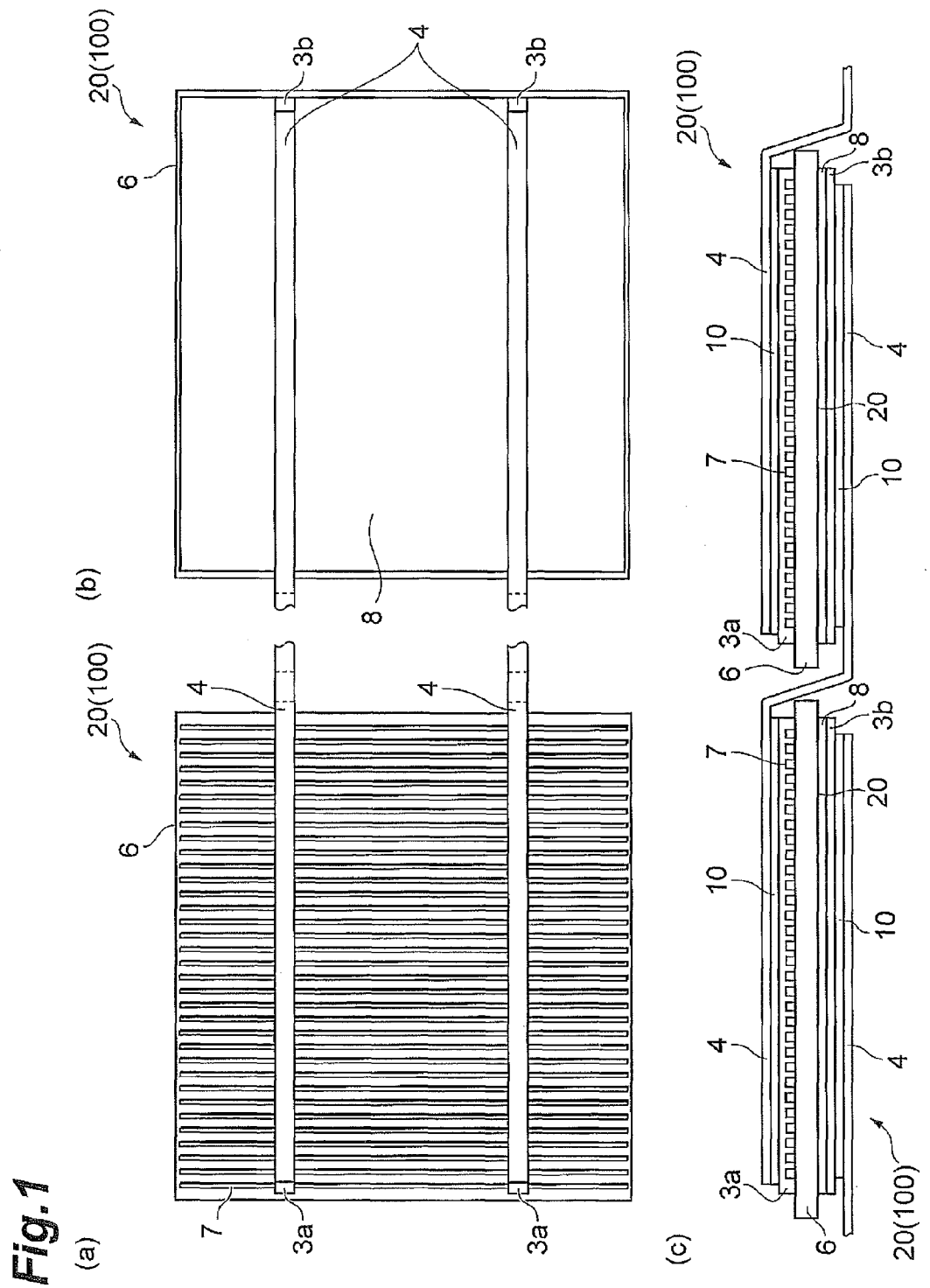
FIG. 1 is a schematic view showing the main part of one embodiment of a solar battery module according to the present invention.

Hereinbelow, the present embodiment will be described in details, but the present invention is not intended to be limited to the following embodiment.

<Electrically Conductive Adhesive Composition>

An electrically conductive adhesive composition according to the present embodiment comprises (A) electrically conductive particles containing metal of which melting point is 220° C. or less, (B) a thermosetting resin, and (C) a thermal cationic polymerization initiator.

(Component (A): Electrically Conductive Particles)

(A) Electrically conductive particles contain a metal of which melting point is 220° C. or less. Since a metal portion formed by melting the metal can form a strong electrically conductive path when such electrically conductive particles are used in the electrically conductive adhesive composition, it is possible to attempt an enhancement in the power generation efficiency associated with low resistance and an enhancement in the resistance to heat distortion in a temperature cycling test in comparison with a relatively thin and weak path formed by contact among particles such as silver particles.

The melting point of the metal contained in (A) electrically conductive particles is preferably 180° C. or less, and more preferably 150° C. or less, from the viewpoint that it is easy to form a strong electrically conductive path. The lower limit of the melting point of the aforementioned metal contained in (A) electrically conductive particles is, but is not particularly limited to, for example, about 100° C. It is possible to measure the melting point by, for example, differential scanning calorimetry (DSC).

The melting point of the whole metal contained in (A) electrically conductive particles is preferably 220° C. or less, more preferably 180° C. or less, and further preferably 150° C. or less, from the viewpoint that it is easy to form a strong electrically conductive path. The lower limit of the melting point of the whole metal contained in (A) electrically conductive particles is, but is not particularly limited to, for example, about 100° C.

It is preferable that the metal contained in (A) electrically conductive particles be a metal other than lead (Pb) from the viewpoint that the load on the environment is small. As such a metal, at least one selected from the group consisting of bismuth (Bi), indium (In), tin (Sn), and zinc (Zn) is preferable. These metals are used singly or in combination of two or more, and may be an alloy containing two or more metals. It is preferable that the alloy contain a high-melting-point ingredient such as platinum (Pt), gold (Au), silver (Ag), copper (Cu), nickel (Ni), palladium (Pd), and aluminum (Al) to an extent that the melting point of the whole metal in (A) electrically conductive particles is 220° C. or less, from the viewpoint of obtaining better connection reliability.

As a metal contained in (A) electrically conductive particles, Sn42-Bi58 solder (the melting point 138° C.), Sn48-In52 solder (the melting point 117° C.), Sn42-Bi57-Ag1 solder (the melting point 139° C.), Sn90-Ag2-Cu0.5-Bi7.5 solder (the melting point 189° C.), Sn89-Zn8-Bi3 solder (the melting point 190° C.), Sn91-Zn9 solder (the melting point 197° C.), and Sn96.5-Ag3-Cu0.5 solder (the melting point 217° C.) are preferable from the viewpoint of exhibiting clear solidification behavior after melting. The solidification behavior means that a metal becomes cold to solidify after melting. Of these, Sn42-Bi58 solder is more preferable from the viewpoint that it is further excellent in the availability, the low-temperature connectivity, and the wettability. These are used singly or in combination of two or more.

The average particle size of (A) electrically conductive particles, is preferably 0.1 μm or more, more preferably 1 μm or more, further preferably and 5 μm or more, from the viewpoint of preventing the viscosity of the electrically conductive adhesive composition from increasing and obtaining better workability. The average particle size of (A) electrically conductive particles is preferably 100 μm or less, more preferably 50 μm or less, and further preferably 30 μm or less, from the viewpoint of obtaining better printability and connection reliability. From such viewpoints, the average particle size of (A) electrically conductive particles is preferably 0.1 to 100 μm. The average particle size of (A) electrically conductive particles is more preferably 1 to 50 μm from the viewpoint of obtaining better printability and workability of the electrically conductive adhesive composition. The average particle size of (A) electrically conductive particles is further preferably 5 to 30 μm from the viewpoint of enhancing the storage stability of the electrically conductive adhesive composition and the mounting reliability of the cured product. The average particle size is determined by, for example, the laser diffraction scattering method (for example, Kamioka Mining Test Method No. 2).

(A) Electrically conductive particles are not limited to particles composed of only a metal of which melting point is 220° C. or less, and may contain a metal having a melting point higher than 220° C. (A) Electrically conductive particles may be electrically conductive particles prepared by coating the surface of particles composed of a solid material other than metals, such as ceramics, silica, and resin materials, with a metal film composed of a metal of which melting point is 220° C. or less, or may be a mixture of a plurality of types of electrically conductive particles.

The content of (A) electrically conductive particles in the electrically conductive adhesive composition, is preferably 5% by mass or more, more preferably 10% by mass or more, further preferably 15% by mass or more, and particularly preferably 45% by mass or more, relative to the total amount of the electrically conductive adhesive composition, from the viewpoint of obtaining better electrical conductivity of the cured product of the electrically conductive adhesive composition. The content of (A) electrically conductive particles is preferably 95% by mass or less, more preferably 90% by mass or less, and further preferably 85% by mass or less relative to the total amount of the electrically conductive adhesive composition, from the viewpoint of preventing the viscosity of the electrically conductive adhesive composition from increasing and of obtaining better workability and the viewpoint of preventing the content of components other than (A) electrically conductive particles (hereinbelow, referred to as "adhesive components") in the electrically conductive adhesive composition from becoming relatively low and of obtaining better mounting reliability of the cured product. From such viewpoints, the content of (A) electrically conductive particles is preferably 5 to 95% by mass. The content of (A) electrically conductive particles is more preferably 10 to 90% by mass from the viewpoint of further enhancing the workability and the electrical conductivity, and further preferably 15 to 85% by mass from the viewpoint of further enhancing the mounting reliability of the cured product.

It should be noted that electrically conductive particles composed of a metal of which melting point is more than 220° C. may be used in combination with (A) electrically conductive particles. Examples of the metal of which melting point is more than 220° C. include Pt, Au, Ag, Cu, Ni, Pd, Al and alloys composed of two or more of these metals. Examples of such electrically conductive particles include Au powder, Ag powder, Cu powder, and Ag-plated Cu powder. As a commercially available product, for example, "MA05K" (manufactured by Hitachi Chemical Co., Ltd., product name), which is silver-plated copper powder, is available.

In the case where (A) electrically conductive particles contain a metal "a1" having a melting point of 220° C. or less and a metal "a2" having a melting point more than 220° C., the combination ratio (a1:a2, a ratio by mass) is preferably 99:1 to 50:50, and more preferably 99:1 to 60:40 from the viewpoint of obtaining better wettability and electrical conductivity.

In the electrically conductive adhesive composition according to the present embodiment, the combination ratio of the content of the adhesive component to the content of (A) electrically conductive particles (the content of the adhesive component/the content of (A) electrically conductive particles) is preferably 5/95 to 50/50 in terms of the solid content ratio (the ratio by mass) in the electrically conductive adhesive composition from the viewpoint of further effectively obtaining effects caused by (A) electrically conductive particles. The combination ratio is more preferably 10/90 to 30/70 from the viewpoint of being further excellent in the adhesive property, the electrical conductivity, and the workability. If the combination proportion is 5/95 or more, better workability is obtained by suppressing the viscosity of the adhesive composition from increasing, and also it is possible to sufficiently secure the adhesive strength of the electrically conductive adhesive composition. If the combination proportion is 50/50 or less, it is easy to secure the electrical conductivity.

(Component (B): Thermosetting Resin)

(B) Thermosetting resin has a function to adhere to an adherend while functioning as a binder component which bonds the electrically conductive particles in the electrically conductive adhesive composition and a filler to be added as required one another. Examples of such a thermosetting resin include thermosetting organic polymer compounds, such as epoxy resins, (meth)acrylic resins, maleimide resins and cyanate resins, and precursors thereof "(Meth)acrylic resins" refer to methacrylic resins and acrylic resins. Of these, epoxy resins and polymers having structural units derived from a compound having a polymerizable carbon-carbon double bond (for example, (meth)acrylic resins and maleimide resins) are preferable. These thermosetting resins are further excellent in the heat resistance and the adhesive property and also the resins are excellent in the workability because it is possible to handle the resins in a liquid condition if dissolved or dispersed in an organic solvent as required. From the viewpoint of being further excellent in the availability and the adhesive property with an adherend, epoxy resins are more preferable. (B) Thermosetting resin is used singly or in combination of two or more.

As the epoxy resin, the known compounds may be used without limitation as long as they are compounds having two or more epoxy groups per molecule. Examples of such an epoxy resin include bisphenol A, bisphenol F, bisphenol AD, and epoxy resins derived from these resins and epichlorohydrin.

As the epoxy resin, it is possible to use commercially available products. Examples of the epoxy resin include AER-X8501 (manufactured by Asahi Kasei Corporation, product name), R-301 (manufactured by Mitsubishi Chemical Corporation, product name), YL-980 (manufactured by Mitsubishi Chemical Corporation, product name), which are bisphenol A-type epoxy resins; YDF-170 (manufactured by Tohto Kasei Co., Ltd., product name), YL-983 (manufactured by Mitsubishi Chemical Corporation, product name), and YL-983U (manufactured by Mitsubishi Chemical Corporation, product name), which are bisphenol F-type epoxy resins; EXA-4816 (manufactured by DIC Corporation, product name) and EXA-4822 (manufactured by DIC Corporation, product name), which are polyalkyleneoxylated bisphenol A-type epoxy resins; R-1710 (manufactured by Mitsui Petrochemical Industries Ltd., product name), which is a bisphenol AD-type epoxy resin; N-730S (manufactured by DIC Corporation, product name) and Quatrex-2010 (manufactured by The Dow Chemical Company, product name), which are phenol novolac-type epoxy resins; YDCN-702S (manufactured by Tohto Kasei Co., Ltd., product name) and EOCN-100 (manufactured by NIPPON KAYAKU Co., Ltd., product name), which are cresol novolac-type epoxy resins; EPPN-501 (manufactured by NIPPON KAYAKU Co., Ltd., product name), TACTIX-742 (manufactured by The Dow Chemical Company, product name), VG-3010 (manufactured by Mitsui Petrochemical Industries Ltd., product name), 1032S (manufactured by Mitsubishi Chemical Corporation, product name), and 1032-H60 (manufactured by Mitsubishi Chemical Corporation, product name), which are multifunctional epoxy resins; HP-4032 (manufactured by DIC Corporation, product name), which is an epoxy resin having a naphthalene skeleton; EHPE-3150 and CEL-3000 (both manufactured by Daicel Corporation, product names), DME-100 (manufactured by New Japan Chemical Co., Ltd., product name), EX-216L (manufactured by Nagase ChemteX Corporation, product name), which are alicyclic epoxy resins; W-100 (manufactured by New Japan Chemical Co., Ltd., product name), which is an aliphatic epoxy resin; ELM-100 (manufactured by Sumitomo Chemical Co., Ltd., product name), YH-434L (manufactured by Tohto Kasei Co., Ltd., product name), TETRAD-X and TETRAD-C (both manufactured by MITSUBISHI GAS CHEMICAL COMPANY, INC., product names), 630 and 630L SD (both manufactured by Mitsubishi Chemical Corporation, product names), which are amine-type epoxy resins; DENACOL EX-201 (manufactured by Nagase ChemteX Corporation, product name), which is a resorcin-type epoxy resin; DENACOL EX-211 (manufactured by Nagase ChemteX Corporation, product name), which is a neopentyl glycol-type epoxy resin; DENACOL EX-212 (manufactured by Nagase ChemteX Corporation, product name), which is a hexanediol glycol-type epoxy resin; DENACOL EX series (EX-810, 811, 850, 851, 821, 830, 832, 841, and 861 (all manufactured by Nagase ChemteX Corporation, product names), which are ethylene-propylene glycol-type epoxy resins; EXA-4850-1000 (manufactured by DIC Corporation, product name) and EXA-4850-150 (manufactured by DIC Corporation, product name), which are vinyl ether-type epoxy resins; and epoxy resins represented by the following general formula (I), E-XL-24 and E-XL-3L (both manufactured by Mitsui Chemicals, Inc., product names). Of these epoxy resins, bisphenol A-type epoxy resins, bisphenol F-type epoxy resins, bisphenol AD-type epoxy resins, and amine-type epoxy resins are preferable from the viewpoint of less ionic impurities and the excellent reactivity.

[Chemical Formula 1]

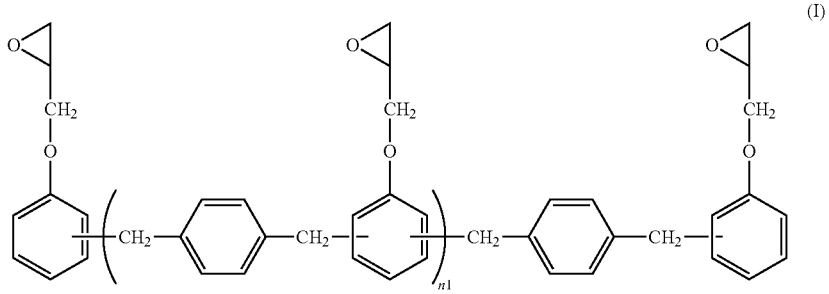

[In the formula (I), n1 represents an integer from 1 to 5.]

The above-described epoxy resin is used singly or in combination of two or more.

In the case where the electrically conductive adhesive composition comprises an epoxy resin as (B) thermosetting resin, the composition may further comprise an epoxy compound having only one epoxy group per molecule as a reactive diluent. It is possible to obtain such an epoxy compound as a commercially available product. Examples of such an epoxy compound include PGE (manufactured by NIPPON KAYAKU Co., Ltd., product name), PP-101 (manufactured by Tohto Kasei Co., Ltd., product name), ED-502, ED-509, and ED-509S (all manufactured by Asahi Denka Kogyo K.K., product names), YED-122 (manufactured by Yuka Shell Epoxy Kabushiki Kaisha, product name), KBM-403 (manufactured by Shin-Etsu Chemical Co., Ltd., product name), and TSL-8350, TSL-8355, and TSL-9905 (manufactured by Toshiba Silicone Co., Ltd., product names). These are used singly or in combination of two or more. In the case where a reactive diluent is used in the electrically conductive adhesive composition, the content of the reactive diluent is preferably, for example, 0.1 to 30% by mass relative to the total amount of the epoxy resin.

(B) Thermosetting resin may contain a (meth)acrylic resin. A (meth)acrylic resin is a polymer which has a structural unit derived from a (meth)acrylate compound having a polymerizable carbon-carbon double bond. "(Meth)acrylates" refer to methacrylates and acrylates. Examples of such (meth)acrylate compounds include monoacrylate compounds, monomethacrylate compounds, diacrylate compounds, and dimethacrylate compounds.

Examples of the monoacrylate compound include methyl acrylate, ethyl acrylate, propyl acrylate, isopropyl acrylate, n-butyl acrylate, isobutyl acrylate, t-butyl acrylate, amyl acrylate, isoamyl acrylate, hexyl acrylate, heptyl acrylate, octyl acrylate, 2-ethylhexyl acrylate, nonyl acrylate, decyl acrylate, isodecyl acrylate, lauryl acrylate, tridecyl acrylate, hexadecyl acrylate, stearyl acrylate, isostearyl acrylate, cyclohexyl acrylate, isobornyl acrylate, diethylene glycol acrylate, polyethylene glycol acrylate, polypropylene glycol acrylate, 2-methoxyethyl acrylate, 2-ethoxyethyl acrylate, 2-butoxyethyl acrylate, methoxydiethylene glycol acrylate, methoxypolyethylene glycol acrylate, dicyclopentenyloxyethyl acrylate, 2-phenoxyethyl acrylate, phenoxydiethylene glycol acrylate, phenoxypolyethylene glycol acrylate, 2-benzoyloxyethyl acrylate, 2-hydroxy-3-phenoxypropyl acrylate, benzyl acrylate, 2-cyanoethyl acrylate, γ-acryloxyethyltrimethoxysilane, glycidyl acrylate, tetrahydrofurfuryl acrylate, dimethylaminoethyl acrylate, diethylaminoethyl acrylate, acryloxyethyl phosphate, and acryloxyethyl phenyl acid phosphate.

Examples of the monomethacrylate compound include methyl methacrylate, ethyl methacrylate, propyl methacrylate, isopropyl methacrylate, n-butyl methacrylate, isobutyl methacrylate, t-butyl methacrylate, amyl methacrylate, isoamyl methacrylate, hexyl methacrylate, heptyl methacrylate, octyl methacrylate, 2-ethylhexyl methacrylate, nonyl methacrylate, decyl methacrylate, isodecyl methacrylate, lauryl methacrylate, tridecyl methacrylate, hexadecyl methacrylate, stearyl methacrylate, isostearyl methacrylate, cyclohexyl methacrylate, isobornyl methacrylate, diethylene glycol methacrylate, polyethylene glycol methacrylate, polypropylene glycol methacrylate, 2-methoxyethyl methacrylate, 2-ethoxyethyl methacrylate, 2-butoxyethyl methacrylate, methoxy diethylene glycol methacrylate, methoxy polyethylene glycol methacrylate, dicyclopentenyloxyethyl methacrylate, 2-phenoxyethyl methacrylate, phenoxy diethylene glycol methacrylate, phenoxypolyethylene glycol methacrylate, 2-benzoyloxyethyl methacrylate, 2-hydroxy-3-phenoxypropyl methacrylate, benzyl methacrylate, 2-cyanoethyl methacrylate, γ-methacryloxyethyltrimethoxysilane, glycidyl methacrylate, tetrahydrofurfuryl methacrylate, dimethylaminoethyl methacrylate, diethylaminoethyl methacrylate, methacryloxyethyl phosphate, and methacryloxyethyl phenyl acid phosphate.

Examples of the diacrylate compound include ethylene glycol diacrylate; 1,4-butanediol diacrylate; 1,6-hexanediol diacrylate; 1,9-nonanediol diacrylate; 1,3-butanediol diacrylate; neopentyl glycol diacrylate; diethylene glycol diacrylate; triethylene glycol diacrylate; tetraethylene glycol diacrylate; polyethylene glycol diacrylate; tripropylene glycol diacrylate; polypropylene glycol diacrylate; reaction products of 1 mole of bisphenol A, bisphenol F, or bisphenol AD and 2 moles of glycidyl acrylate; diacrylates of polyethylene oxide adducts of bisphenol A, bisphenol F, or bisphenol AD; diacrylates of polypropylene oxide adducts of bisphenol A, bisphenol F, or bisphenol AD; bis(acryloxypropyl)polydimethylsiloxane; and bis(acryloxypropyl)methylsiloxane-dimethylsiloxane copolymers.

Examples of the dimethacrylate compound include ethylene glycol dimethacrylate; 1,4-butanediol dimethacrylate; 1,6-hexanediol dimethacrylate; 1,9-nonanediol dimethacrylate; 1,3-butanediol dimethacrylate; neopentyl glycol dimethacrylate; diethylene glycol dimethacrylate; triethylene glycol dimethacrylate; tetraethylene glycol dimethacrylate; polyethylene glycol dimethacrylate; tripropylene glycol dimethacrylate; polypropylene glycol dimethacrylate; reaction products of 1 mole of bisphenol A, bisphenol F, or bisphenol AD and 2 moles of glycidyl methacrylate; dimethacrylates of polyethylene oxide adducts of bisphenol A, bisphenol F, or bisphenol AD; polypropylene oxide adducts of bisphenol F or bisphenol AD; bis(methacryloxypropyl)polydimethylsiloxane; and bis(methacryloxypropyl)methylsiloxane-dimethylsiloxane copolymers.

These (meth)acrylate compounds are used singly or in combination of two or more. When (B) thermosetting resin contains a (meth)acrylic resin, the (meth)acrylate compound may be used after being polymerized in advance, or polymerization may be performed concurrently with mixing the (meth) acrylate compound with (A) electrically conductive particles. The (meth)acrylate compounds are used singly or in combination of two or more.

As the (meth)acrylic resin, it is possible to use commercially available products. Examples of the (meth)acrylic resin include FINEDIC A-261 (manufactured by DIC Corporation, product name) and FINEDIC A-229-30 (manufactured by DIC Corporation, product name).

In the case where (B) thermosetting resin contains a (meth)acrylic resin, it is preferable that the electrically conductive adhesive composition comprise a radical polymerization initiator. As the radical polymerization initiator, organic peroxides are preferable from the viewpoint of suppressing voids effectively and the like. The decomposition temperature of the organic peroxide is preferably 130 to 200° C. from the viewpoint of enhancing the curability and the viscosity stability of the adhesive component.

As the radical polymerization initiator, it is possible to use those usually employed. Examples of the radical polymerization initiator include peroxides such as benzoyl peroxide and t-butyl peroxy-2-ethyl hexanoate; and azo compounds such as azobisisobutyronitrile and azobisdimethylvaleronitrile.

The content of the radical polymerization initiator is preferably 0.01 to 20% by mass, more preferably 0.1 to 10% by mass, and further preferably 0.5 to 5% by mass relative to the total amount of the electrically conductive adhesive composition.

The content of (B) thermosetting resin in the electrically conductive adhesive composition is preferably 1% by mass or more, more preferably 5% by mass or more, and further preferably 10% by mass or more relative to the total amount of the electrically conductive adhesive composition, from the viewpoint of obtaining further excellent connection strength. The content of (B) thermosetting resin is preferably 60% by mass or less, more preferably 40% by mass or less, and further preferably 30% by mass or less relative to the total amount of the electrically conductive adhesive composition, from the viewpoint that it is easy to secure sufficient electrical conductivity.

(Component (C): Thermal Cationic Polymerization Initiator)

The electrically conductive adhesive composition according to the present embodiment comprises (C) thermal cationic polymerization initiator, which releases an acid and the like by heating to thereby initiate polymerization. Of cationic polymerization initiators, (C) thermal cationic polymerization initiator is excellent in the heating process applicability and the heat curability. In addition to the effect of providing sufficient connection strength by promoting polymerization of (B) thermosetting resin, (C) thermal cationic polymerization initiator has an effect of forming an electrically conductive path by promotion of melting and aggregation of the electrically conductive particles and also development of sufficient wettability at the connection portion by removal of the surface oxide film on the electrically conductive particles and on the connection portion with a free acid released from (C) thermal cationic polymerization initiator.

Examples of (C) thermal cationic polymerization initiator include sulfonium salts, thiophenium salts, thiolanium salts, benzylanimonium salts, pyridinium salts, hydrazinium salts, carboxylic acid esters, sulfonic acid esters, amine imides, diazonium salts, iodonium salts, and phosphonium salts.

Examples of commercially available products of (C) thermal cationic polymerization initiator include ADEKAOPTON CP-66 and ADEKAOPTON CP-77 (both manufactured by ADEKA CORPORATION), San-Aid SI-25, San-Aid SI-45, San-Aid SI-60L, San-Aid SI-60LA, San-Aid SI-60B, San-Aid SI-80L, San-Aid SI-100L, San-Aid SI-110L, San-Aid SI-180L, San-Aid SI-110, and San-Aid SI-180 (all manufactured by SANSBIN CHEMICAL INDUSTRY CO., LTD.), CI-2855 (manufactured by Nippon Soda Co., Ltd.), and PI-2074 (manufactured by Rhodia Japan Co., Ltd.).

It should be noted that it is possible to use San-Aid SI-25, San-Aid SI-45, San-Aid SI-60L, San-Aid SI-60LA, San-Aid SI-60B, San-Aid SI-80L, San-Aid SI-100L, San-Aid SI-110L, San-Aid SI-180L, San-Aid SI-110, and San-Aid SI-180 (all manufactured by SANSHIN CHEMICAL INDUSTRY CO., LTD.), CI-2855 (manufactured by Nippon Soda Co., Ltd.), and P1-2074 (manufactured by Rhodia Japan Co., Ltd.) also as a photo-cationic polymerization initiator described below.

As (C) thermal cationic polymerization initiator, sulfonium salts are preferable from the viewpoint of being excellent in the rapid curability at a low curing temperature in the heating connection process, the length of usable time, the toughness of the cured product and the like. Examples of commercially available products of such thermal cationic polymerization initiators include "San-Aid SI-60L", "San-Aid SI-80L", and "San-Aid SI-100L" (all manufactured by SANSHIN CHEMICAL INDUSTRY CO., LTD., product names).

As (C) thermal cationic polymerization initiator, compounds which release at least one selected from the group consisting of an inorganic ion containing an antimony atom, an inorganic ion containing a phosphorus atom, and an organic acid ion containing a boron atom as a free acid by heating are preferable, from the viewpoint that the effect of removing the surface oxide film from the electrically conductive particles is further excellent. In particular, from the viewpoint of the rapid curability on (B) thermosetting resin and of being excellent in the ability of removing the surface oxide film on (A) electrically conductive particles, compounds which release an inorganic ion containing an antimony atom by heating are more preferable. Examples of the commercially available products include "San-Aid SI-25", "San-Aid SI-45", "San-Aid SI-60L", "San-Aid SI-80L", and "San-Aid SI-100L" (all manufactured by SANSHIN CHEMICAL INDUSTRY CO., LTD., product names).

The content of (C) thermal cationic polymerization initiator is preferably 0.01 parts by mass or more and more preferably 0.1 parts by mass or more relative to 100 parts by mass of (B) thermosetting resin from the viewpoint that it is easy to obtain excellent curability. The content of (C) thermal cationic polymerization initiator is preferably 90 parts by mass or less and more preferably 50 parts by mass or less from the viewpoint of suppressing the viscosity from increasing and of obtaining excellent storage stability of the electrically conductive adhesive composition.

The reaction start temperature (polymerization start temperature) of (B) thermosetting resin and (C) thermal cationic polymerization initiator is preferably 30° C. or more, more preferably 40° C. or more, and further preferably 60° C. or more from the viewpoint that it is easy to obtain excellent storage stability. In particular, even in the case where the time taken to reach the set temperature in a wiring connection at the time of production of the solar battery module is long (slow), if the reaction start temperature is within the range of these temperature, it is easy to suppress the prevention of melting and aggregation of the electrically conductive particles due to the progress of curing of (B) thermosetting resin before melting and aggregation of (A) electrically conductive particles occur. The reaction start temperature of (B) thermosetting resin and (C) thermal cationic polymerization initiator is preferably 200° C. or less, more preferably 180° C. or less, and further preferably 160° C. or less from the viewpoint that it is easy to obtain sufficient connection strength in the wiring connection step at the time of production of the solar battery module by the fact that excellent curability of (B) thermosetting resin is obtained. The reaction start temperature is preferably 30 to 200° C., more preferably 40 to 180° C., further preferably 40 to 160° C., and particularly preferably 60 to 160° C. from the viewpoint that it is easy to obtain excellent connection strength by progress of curing at the time of the heating connection.

The reaction start temperature of (B) thermosetting resin and (C) thermal cationic polymerization initiator refers to a temperature at which a curing exothermic reaction starts when (B) thermosetting resin and (C) thermal cationic polymerization initiator are combined, without using a solvent, in the same combination ratio as the combination ratio in the electrically conductive adhesive composition and are increased in the temperature by DSC measurement. It is possible to measure the reaction start temperature in according with the following procedure, for example. First, (B) thermosetting resin and (C) thermal cationic polymerization initiator are mixed without using a solvent. Then, a DSC chart showing a curing exothermic peak in a single curing system when increased in the temperature by DSC measurement is obtained. Subsequently, the rise temperature (DSC Onset) of the curing exothermic peak is obtained as the reaction start temperature. It is possible herein to use the temperature, corresponding to the point of intersection of the extension line of the baseline passing through the point A at which the exothermic peak of the DSC chart rises and the tangent line at the inflection point of the DSC curve between the point A at which the exothermic peak of the DSC chart rises and the exothermic peak point B, as the Onset temperature.

(Component (D): Flux Activator)

The electrically conductive adhesive composition according to the present embodiment may further comprise (D) flux activator in addition to (C) thermal cationic polymerization initiator from the viewpoint of further enhancing the electrical conductivity. (D) Flux activator exhibits the ability of removing the oxide film formed on the surface of (A) electrically conductive particles. By using such a flux activator, removal of the oxide film, which prevents (A) electrically conductive particles from melting and aggregating, is further promoted, and the electrical conductivity is further enhanced. For (D) flux activator, it is possible to use the known compounds without limitation as long as they are compounds which do not inhibit curing reaction of (C) thermal cationic polymerization initiator.

Examples of (D) flux activator include rosin resins, and compounds having a carboxyl group, a phenolic hydroxyl group, or an alcoholic hydroxyl group in the molecule. Of these, compounds having a hydroxyl group and a carboxyl group in the molecule are preferable, and aliphatic dihydroxycarboxylic acids are more preferable, since they exhibit good flux ability and exhibit reactivity with an epoxy resin which can be used as the aforementioned (B) thermosetting resin. Specifically, compounds represented by the following general formula (II) or tartaric acid are preferable.

[Chemical Formula 2]

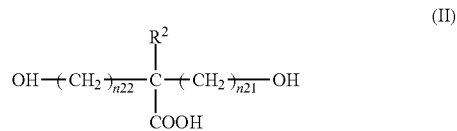

(II)

In the formula (II), $R^2$ represents an alkyl group in which the number of the carbon atoms is from 1 to 5, and a methyl group, an ethyl group, or a propyl group is preferable from the viewpoint of further effectively obtaining good connection strength and connection reliability. Further, n21 and n22 each independently represent an integer from 0 to 5, and it is preferable that n21 be 0 and n22 be 1, or that both n21 and n22 be 1, from the viewpoint of further effectively obtaining good connection strength and connection reliability.

Examples of the compound represented by the above-described general formula (II) include 2,2-bis(hydroxymethyl)propionic acid, 2,2-bis(hydroxymethyl)butanoic acid, and 2,2-bis(hydroxymethyl)pentanoic acid.

From the viewpoint that the reduction in the meltability of the metal is suppressed in the case where the amount of the surface oxide film on the connection portion is large and that it is easy to obtain excellent electrical conductivity, the content of (D) flux activator is preferably 0.5 parts by mass or more, and more preferably 1 parts by mass or more relative to 100 parts by mass of the total amount of (A) electrically conductive particles. The content of (D) flux activator is preferably 20 parts by mass or less, more preferably 15 parts by mass or less and further preferably 10 parts by mass or less relative to 100 parts by mass of the total amount of (A) electrically conductive particles, from the viewpoint that it is easy to obtain excellent storage stability and printability. The content of (D) flux activator is preferably 0.5 to 20 parts by mass and more preferably 0.5 to 15 parts by mass relative to 100 parts by mass of the total amount of (A) electrically conductive particles from the viewpoint of further effectively obtaining good connection strength and connection reliability. The content of (D) flux activator is further preferably 1 to 10 parts by mass from the viewpoint of being further excellent in the storage stability and the electrical conductivity.

(Other Components)

The electrically conductive adhesive composition according to the present embodiment may comprise a photo-cationic polymerization initiator which releases an acid capable of starting cationic polymerization by irradiation of energy rays such as ultraviolet (except compounds which can be used also as a thermal cationic polymerization initiator). Examples of the photo-cationic polymerization initiator include aromatic sulfonium salts, aromatic iodonium salts, aromatic diazonium salts, and aromatic ammonium salts.

Examples of the commercially available product of the photo-cationic polymerization initiator include CPI-100P, CPI-110P, CPI-101A, CPI-200K, and CPI-210S (all manufactured by San-Apro Ltd.), CYRACURE photocuring initiator UVI-6990, CYRACURE photocuring initiator UVI-6992, and CYRACURE photocuring initiator UN/I-6976 (all manufactured by Dow Chemical Japan Ltd.), Adekaoptomer SP-150, Adekaoptomer SP-152, Adekaoptomer SP-170, Adekaoptomer SP-172, and Adekaoptomer SP-300 (all manufactured by ADEKA CORPORATION), CI-5102 (manufactured by Nippon Soda Co., Ltd.), ESACURE 1064 and ESACURE 1187 (both manufactured by Lamberti S.p.A.), Omnicat 550 (manufactured by IGM resins), and IRGACURE 250 (manufactured by Ciba Specialty Chemicals).

The electrically conductive adhesive composition according to the present embodiment may further comprise a curing catalyst in addition to (C) thermal cationic polymerization initiator from the viewpoint of control of the curing rate. A curing catalyst has a role of promoting polymerization of (B) thermosetting resin. As such a curing catalyst, imidazole compounds are preferable from the viewpoint of being excellent in the length of usable time, the heat resistance of the cured product, and the like. Of these, imidazole epoxy resin curing agents are preferable. Examples of the commercially available products include imidazole epoxy resin curing agents, such as 2P4MHZ-PW (2-phenyl-4-methyl-5-hydroxymethyl imidazole), 2PHZ-PW (2-phenyl-4,5-dihydroxymethyl imidazole), C11Z-CN (1-cyanoethyl-2-undecyl imidazole), 2E4MZ-CN (1-cyanoethyl-2-ethyl-4-methyl imidazole), 2PZ-CN (1-cyanoethyl-2-phenylimidazole), 2MZ-A (2,4-diamino-6-[2'-methylimidazolyl-(1')]ethyl-s-triazine), 2E4MZ-A (2,4-diamino-6-[2'-ethyl-4'methylimidazolyl-(1')]-ethyl-s-triazine), and 2MAOK-PW (2,4-diamino-6-[2'-methylimidazolyl-(1')]-ethyl-s-triazine isocyanuric acid adduct) (all manufactured by SHIKOKU CHEMICALS CORPORATION, product names). These curing catalysts are used singly or in combination of two or more.

The content of the curing catalyst is preferably 0.01 parts by mass or more and more preferably 0.1 parts by mass or more relative to 100 parts by mass of (B) thermosetting resin from the viewpoint that it is easy to obtain excellent curability. The content of the curing catalyst is preferably 90 parts by mass or less and more preferably 50 parts by mass or less from the viewpoint that the increase in the viscosity is suppressed and it is easy to obtain excellent workability during handling of the electrically conductive adhesive composition.

The electrically conductive adhesive composition according to the present embodiment may comprise, in addition to the above-described each component, a flexibilizer for stress relaxation or an additive for enhancing the workability (at least one additive selected from the group consisting of diluents, adhesive strength enhancing agents, wettability enhancing agents, and defoamers) as required. In addition to these components, various additives may be comprised to the extent in which the effects according to the present embodiment are not inhibited.

Examples of the flexibilizer include liquid polybutadiene (manufactured by Ube Industries, Ltd., product names "CTBN-1300×31" and "CTBN-1300×9"; manufactured by Nippon Soda Co., Ltd., product name "NISSO-PB-C-2000"), urethane acrylate oligomers (manufactured by Shin Nakamura Chemical Co., Ltd., product names "NK Oligo U-200PA" and "NK Oligo UA-4200"; manufactured by NIPPON KAYAKU Co., Ltd., product names "UXF-4001-M35", "UXF-4200", "UX-3204", "UX-0937", and "UX-4101"; manufactured by Kyoeisha Chemical Co., Ltd., product names "UF-B01P", "UF-B01X", "UF-B01T", "UF-A01P", and "UF-07DF"). In the case where a flexibilizer is used, the content of the flexibilizer is preferably 0.01 to 500 parts by mass relative to the total amount of 100 parts by mass of (B) thermosetting resin. In the case where the above-described urethane acrylate oligomer is used, the electrically conductive adhesive composition may contain a radical polymerization initiator.

The electrically conductive adhesive composition according to the present embodiment may comprise a coupling agent such as silane coupling agents and titanium coupling agents as an adhesive strength enhancing agent from the viewpoint of enhancing the adhesive strength. An example the silane coupling agent includes product name "KBM-573" manufactured by Shin-Etsu Chemical Co., Ltd. The electrically conductive adhesive composition according to the present embodiment may comprise a wettability enhancing agent such as anionic surfactants and fluorine surfactants, from the viewpoint of enhancing the wettability. Additionally, the electrically conductive adhesive composition may comprise silicone oil and the like as a defoamer. The above-described adhesive strength enhancing agent, the wettability enhancing agent, and the defoamer are respectively used singly or in combination of two or more. In the case where these additives are used, the content of each additive is preferably 0.1 to 10% by mass relative to the total amount of the electrically conductive adhesive composition.

The adhesive component of the electrically conductive adhesive composition according to the present embodiment may comprise a diluent as required in order to make the workability in the time of preparing a paste composition and the application workability at the time of use better. As such a diluent, organic solvents of which melting point is relatively high, such as γ-butyrolactone, ethyl acetate, butyl cellosolve, Carbitol, butyl cellosolve acetate, Cabitol acetate, dipropylene glycol monomethyl ether, ethylene glycol diethyl ether, and α-terpineol are preferable. In the case where the diluent is comprised, the content of the diluent is preferably 0.1 to 30% by mass relative to the total amount of the electrically conductive adhesive composition.

The electrically conductive adhesive composition according to the present embodiment may comprise a filler. Examples of the filler include polymer particles such as silicone rubber, acrylic rubber, and polystyrene; and inorganic particles such as diamond, boron nitride, aluminum nitride, alumina, and silica. These fillers may be used singly or in combination of two or more.

As the above-described fillers, silicone rubber powder, silicone composite powder, and silicone resin powder are preferable from the viewpoint of being excellent in the impact absorbency of the connection portion. Examples of the silicone rubber powder include product names "KMP-597", "KW-598", "KMP-594", and "X52-875" manufactured by Shin-Etsu Silicone Co., Ltd. Examples of the silicone composite powder include product names "KMP-600", "KMP-601", "KMP-605", and "X52-7030" manufactured by Shin-Etsu Silicone Co., Ltd. Examples of the silicone resin powder include product names "KMP-590", "KMP-701", "X-52-854", and "X52-1621" manufactured by Shin-Etsu Silicone Co., Ltd.

As the above-described filler, silica fillers are preferable from the viewpoint of being excellent in prevention of precipitation of the electrically conductive adhesive composition. Examples of the silica filler include product names "R972", "R972V", "R972CF", "R974", "R202", "R805", "R812", "R812S", "RX200", and "RY200" manufactured by NIPPON AEROSIL CO., LTD.

The electrically conductive adhesive composition according to the present embodiment may comprise a curing agent in order to adjust the curing rate of (B) thermosetting resin (for example, an epoxy resin).

The curing agent is not particularly limited as long as it is a curing agent conventionally used, and commercial products are available. Examples of the commercially available curing agent include H-1 (manufactured by Meiwa Plastic Industries, Ltd, product name) and VR-9300 (manufactured by Mitsui Toatsu Chemicals, Inc., product name), which are phenol novolac resins; XL-225 (manufactured by Mitsui Toatsu Chemicals, Inc., product name), which is a phenol aralkyl resin; MTPC (manufactured by Honshu Chemical Industry Co., Ltd., product name), which is a p-cresol novolac resin represented by the following general formula (III); AL-VR-9300 (manufactured by Mitsui Toatsu Chemicals, Inc., product name), which is an allylated phenol novolac resin; and PP-700-300 (manufactured by Nippon Oil Chemical Co., Ltd., product name), which is a special phenol resin represented by the following general formula (IV).

[Chemical Formula 3]

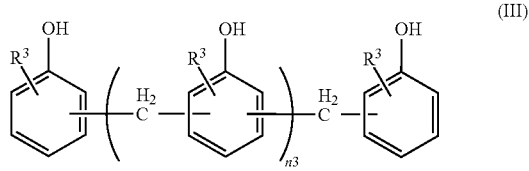

(III)

[Chemical Formula 4]

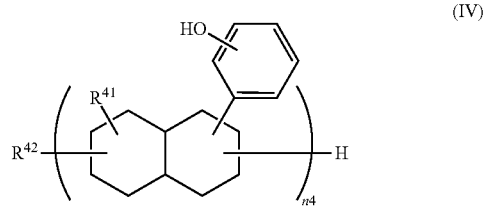

(IV)

In the formula (III), $R^3$ each independently represents a monovalent hydrocarbon group (preferably a methyl group or an allyl group), and n3 represents an integer from 1 to 5. Additionally, in the formula (IV), $R^{41}$ represents an alkyl group (preferably a methyl group or an ethyl group), $R^{42}$ represents a hydrogen atom or a monovalent hydrocarbon group, and n4 represents an integer from 2 to 4.

As the curing agent, those conventionally used as a curing agent such as dicyandiamide can be used, and commercially available products can be obtained. Examples of the commercially available product include ADH, PDH, and SDH (all manufactured by JAPAN HYDRAZINE COMPANY, INC., product names), which are dibasic acid dihydrazides represented by the following general formula (V) and NOVACURE (manufactured by Asahi Kasei Corporation, product name), which is a microcapsule-type curing agent composed of a reaction product of an epoxy resin and an amine compound. These curing agents are used singly or in combination of two or more.

[Chemical Formula 5]

(V)

In the formula (V), $R^5$ represents a divalent aromatic group or a linear or branched-chain alkylene group of which the number of carbon atoms is from 1 to 12, and preferably represents an m-phenylene group or a p-phenylene group.

It is preferable that a curing agent be not substantially comprised in the electrically conductive adhesive composition from the viewpoint of being excellent in the storage stability and the curing time. "Substantially" means being 0.05% by mass or less relative to the total amount of the electrically conductive adhesive composition.

In the present embodiment, for the above-described each component, any of those exemplified in each component may be combined.

The electrically conductive adhesive composition according to the present embodiment can be obtained by mixing, dissolving, disaggregating and kneading, or dispersing the above-described each component at once or in a plurality of times, as a paste-like composition in which each component is homogeneously dispersed. In obtaining a paste-like composition in such a manner, heating may be performed as required. Examples of dispersing and dissolving devices include the known stirrers, kneaders, triple-roll and planetary mixers.

With the electrically conductive adhesive composition according to the present embodiment described above, it is possible to obtain good electrical conductivity and to combine the predetermined adhesive strength and the electrical conductivity even after a high-temperature and high-humidity test (for example, 85° C./85%). Additionally, the electrically conductive adhesive composition according to the present embodiment is used to electrically connect the electrode of a solar battery cell and a wiring member, and, even in a heating step at a low temperature and in a short time, it is possible to combine good connection strength and electrical conductivity.

<A Connection Structure, a Solar Battery Module, and a Method for Producing these>

Next, a connection structure, a solar battery module and a method for producing these according to the present embodiment will be described. The connection structure according to the present embodiment comprises a solar battery cell and a wiring member electrically connected to an electrode arranged on the electrode surface of the solar battery cell via the electrically conductive adhesive composition according to the present embodiment or its cured product, and it is possible to obtain the connection structure by electrically connecting the electrode of the solar battery cell and the wiring member by using the electrically conductive adhesive composition according to the present embodiment. The connection structure according to the present embodiment may comprise a plurality of solar battery cells, and may be obtained by connecting the plurality of solar battery cells to each other via a wiring member.

The solar battery module according to the present embodiment comprises a solar battery cell, a wiring member electrically connected to the electrode arranged on the electrode surface of the solar battery cell via the electrically conductive adhesive composition according to the present embodiment or its cured product, encapsulants each laminated on the light receiving surface side of the solar battery cell and the back surface side opposite to the light receiving surface, a glass member laminated on the encapsulant at the light receiving surface side of the solar battery cell, and a protective film laminated on the encapsulant at the back surface side of the solar battery cell. It is possible to obtain the solar battery module according to the present embodiment, as described below, by electrically connecting the electrode of a solar battery cell and a wiring member using the electrically conductive adhesive composition according to the present embodiment and also by arranging encapsulants, a glass member, and a protective film. The solar battery module according to the present embodiment may comprise a plurality of solar battery cells, and may be obtained by connecting the plurality of solar battery cells to each other via a wiring member and also by arranging encapsulants, a glass member, and a protective film.

Examples of the solar battery cell include heterojunction solar battery cells, crystalline silicon solar battery cells, and back-surface electrode type (back contact type) solar battery cells.

FIG. 1 is a schematic view showing the main part of a solar battery module according to the present embodiment, showing a schematic structure in which a plurality of solar battery cells is connected via wiring to one another. FIG. 1(a) shows the surface (the light receiving surface) side of the solar battery cells, FIG. 1(b) shows the back surface (the surface opposite to the light receiving surface) side, and FIG. 1(c) shows a lateral side.

As shown in FIG. 1, the solar battery module 100 has a plurality of solar battery cells 20, and the plurality of solar battery cells 20 is connected to one another via wiring members 4. The solar battery cells 20 have a substrate 6, grid electrodes 7 and a bus electrode (bus bar electrode, surface electrode) 3a arranged on the surface side of the substrate 6, and a back surface electrode 8 and a bus electrode (bus bar electrode, surface electrode) 3b arranged on the back surface side of the substrate 6. One end of the wiring member 4 is connected to the bus electrodes 3a of one solar battery cells 20 via an electrically conductive adhesive 10 or its cured product. The other end of the wiring member 4 is connected to the bus electrode 3b of other solar battery cell 20 via the electrically conductive adhesive 10 or its cured product. Thereby the solar battery cells 20 are serially connected. The electrically conductive adhesive 10 contains the electrically conductive adhesive composition according to the present embodiment.

Figure 2:
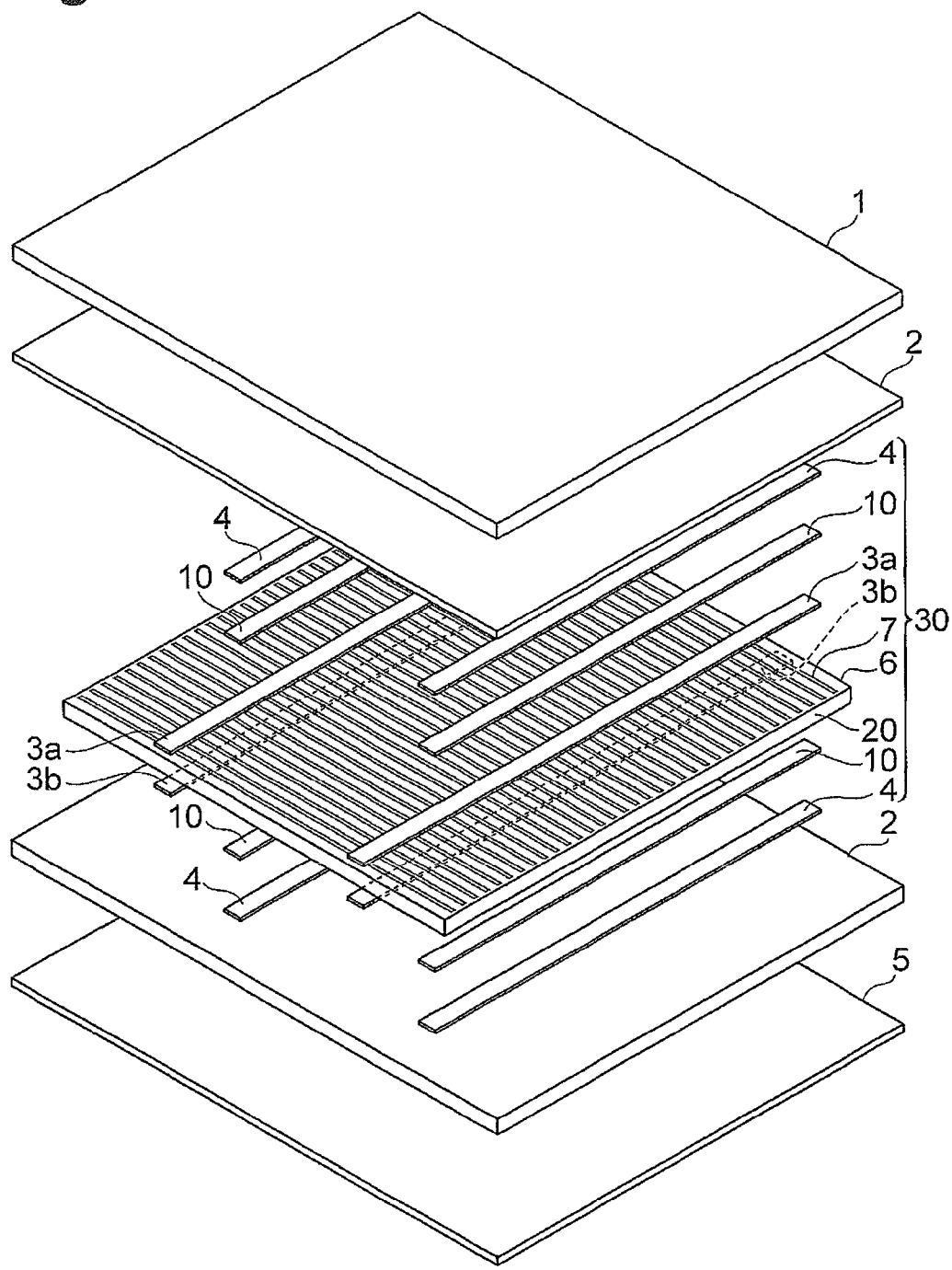
FIG. 2 is a view for describing one embodiment of a method for producing a solar battery module according to the present invention.

FIG. 2 is a view for describing one example of a method for producing a solar battery module according to the present embodiment. The method for producing a solar battery module according to the present embodiment comprises, for example, a step of applying an adhesive, a step of manufacturing a connection structure, a step of the first lamination (a step of laminating an encapsulant), a step of the second lamination (a step of laminating a light transmissive member and a step of laminating a protective film), and a step of heating, in this order.

In the step of applying an adhesive, an electrically conductive adhesive 10 is applied on the electrode surface of the solar battery cell 20 (for example, the surface on which the bus electrode 3a is arranged and the back surface on which the bus electrode 3b is arranged) or on the wiring members 4. In the case of applying on the electrode surfaces, the electrically conductive adhesive 10 is applied on at least the bus electrodes 3a and 3b. The electrically conductive adhesive 10 contains the electrically conductive adhesive composition according to the present embodiment. Examples of the method for applying the electrically conductive adhesive 10 include a method for applying the electrically conductive adhesive 10 on the bus electrodes 3a and 3b or the wiring members 4 by a dispensing method, a screen printing method, a stamping method or the like.

In the step of manufacturing a connection structure, the bus electrodes 3a and 3b of the solar battery cell 20 and the wiring members 4 to be electrically connected to the bus electrodes 3a and 3b are arranged so as to face each other, and also are laminated to thereby obtain a connection structure. In the step of manufacturing a connection structure, for example, via the electrically conductive adhesive 10, one wiring members 4 and the bus electrode 3a are arranged so as to face each other and also other wiring member 4 and the bus electrode 3b are arranged so as to face each other to laminate the aforementioned one wiring member 4, the substrate 6, and the aforementioned other wiring member 4 to thereby manufacture a connection structure 30.

In the first lamination step, encapsulants 2 are laminated on the light receiving surface side of the solar battery cell 20 and on the back surface side opposite to the light receiving surface to thereby laminate the encapsulants 2 on both sides of the connection structure 30. The encapsulants 2 are arranged via the wiring members 4 on each of the light receiving surface side and the back surface side of the solar battery cell 20.

The second lamination step have a step of laminating a light transmissive member, wherein a glass member (a light transmissive member) 1 is laminated on the encapsulant 2 at the light receiving surface side of the solar battery cell 20, and a step of laminating a protective film, wherein a back sheet (a protective film, protective member) 5 is laminated on the encapsulant 2 at the back surface side of the solar battery cell 20. The order of the step of laminating a light transmissive member and the step of laminating a protective film is not particularly limited, and the steps may be performed concurrently.

In the heating step, the laminate obtained in the second lamination step (the laminate having the glass member 1, the encapsulant 2, the back sheet 5, and the solar battery cell 20) is heated to encapsulate the solar battery cell 20 while electrically connecting and attaching the bus electrodes 3a and 3b of the solar battery cell 20 to the wiring members 4. The heating temperature is, for example, from 140 to 190° C., and the heating time is, for example, from 1 to 30 minutes. In the heating step, the laminate may be heat-pressure bonded, and the pressure is, for example, from 0.1 to 0.3 MPa. In the heating step, an electrical connection between the bus electrode 3a and 3b of the solar battery cell 20 and the wiring members 4 and adhesion by curing of the thermosetting resin are performed and also concurrently encapsulation of the solar battery cell 20 is performed, and it is possible to produce a solar battery module at one time.

The method for producing a solar battery module according to the present embodiment may comprise a preliminary pressure bonding step, wherein, after the step of manufacturing a connection structure, the electrical connection between the bus electrodes 3a and 3b of the solar battery cell 20 and the wiring members 4 is made by performing heat-pressure bonding at 140 to 190° C. and a pressure from 0.1 to 6.0 MPa for 0.5 to 60 seconds. Since the connection between the solar battery cell 20 and the wiring members 4 is made by performing the preliminary pressure bonding, the connection structure 30 becomes easy to handle and the workability at the time of production of the solar battery module is enhanced. The connection structure 30 electrically connected by this method is referred to as a solar battery string.

Examples of the method for performing the preliminary pressure bonding step include a hot air method, wherein a connection portion composed of the bus electrodes 3a and 3b of the solar battery cell 20 and the wiring members 4 in a pin-fixed condition at a low pressure is heated by being blown with hot air; and a hot bar method, wherein a smooth hot plate is pressed on. At this time, the above-described connection portion is heat-pressure bonded at a temperature from 140 to 190° C. for 0.5 to 60 seconds and at a pressure from 0.1 to 6.0 MPa to thereby form an electrically-connected connection structure 30.

In the case where preliminary pressure bonding has been performed, for example, it is possible to produce a solar battery module by heat-pressure bonding a laminate, which is obtained by arranging encapsulants 2 on both sides of the connection structure 30 obtained in the preliminary pressure bonding step, arranging the glass member 1 on the encapsulant 2 at the light receiving surface side of the solar battery cell 20 and also arranging the back sheet 5 on encapsulant 2 at the back surface side of the solar battery cell 20, at a temperature from 130 to 180° C. for 1 to 30 minutes and at a pressure from 0.1 to 6 MPa to encapsulate the solar battery cell.

An example of the glass member 1 is dimpled tempered white glass for solar batteries. Examples of the encapsulant 2 include encapsulating resins in which ethylene-vinyl acetate copolymer resin (EVA) and/or polyvinyl butyral are used. Examples of the wiring member 4 include TAB lines which are copper wires dipped in or plated with solder. Examples of the back sheet 5 include PET-based or Tedora-PET lamination materials, and metal foil-PET lamination materials. An example of the substrate 6 is silicon wafers.

The electrically conductive adhesive composition according to the present embodiment can make a connection to the electrode of the solar battery cell in a step similar to the one described above, even in the case where a film-like wiring substrate which has metal wiring arranged on a plastic substrate is used.

FIG. 3 is a schematic cross sectional view showing a connection portion between a solar battery cell and a wiring member. The connection portion of the solar battery cell 20 and the wiring member 4 connected via a cured product of the electrically conductive adhesive composition according to the present embodiment (a wiring joint, for example, the connection portion of the solar battery string composed of the aforementioned connection structure 30) has a structure in which the bus electrode 3 is electrically connected via a metal portion M to the wiring member 4, as shown in FIG. 3(a), when a cross section perpendicular to the direction in which the wiring member 4 extends (for example, the center cross section in the direction in which the wiring member 4 extends) is viewed. The connection portion has the metal portion M, which has a metal electrically conductive path formed by melting and aggregation of (A) electrically conductive particles, and a resin portion R, which has an adhesion reinforcing effect and also is consisted of a cured product of (B) thermosetting resin.

On the cross section perpendicular to the direction in which the wiring member 4 extends, the area ratio between the area of the metal portion and the area of the resin portion, [Metal portion]:[Resin portion] is preferably 5:95 to 90:10, more preferably 10:90 to 75:25, and further preferably 20:80 to 70:30. If this area ratio is 5:95 or more (that is, the amount of the metal portion is not too small), it is easy to suppress the electrical resistance from increasing. If the aforementioned area ratio is 90:10 or less (that is, the amount of the metal portion is not too large), it is easy to obtain excellent connection strength and handleability.

If the metal portion M is not a single portion and the metal portion M is separated into a plurality of portions, there is no hitch to the conductivity and the adhesion reinforcing effect. For example, in the form in which the resin portions R are engaged between the metal portions M as shown in FIG. 3(b), the connection strength rather increases to thereby enhance the reliability, because the stress relaxation effect to the connection portion is promoted. Rapid curing of (B) thermosetting resin with (C) thermal cationic polymerization initiator increases the viscosity of the resin portions R, melting and integration of the electrically conductive particles are suppressed, and thus such a form is achieved. At this time, the optimal area ratio of [metal portion]:[resin portion] is same with the above-described ratio.

Polymerization reaction of (B) thermosetting resin proceeds rapidly with (C) thermal cationic polymerization initiator, a resin cured product having sufficient adhesive strength between the bus electrode 3 and the wiring member 4 is formed, and also an effect of removing surface oxide film of the metal is developed by a released acid, a metal electrically conductive path is formed by melting and aggregation of (A) electrically conductive particles to thereby achieve the structure of the above-described wiring joint shown in FIG. 3. Since, with this structure, the resin cured product reinforces the periphery of the metal electrically conductive path and the bus electrode and concurrently, is responsible for the sufficient adhesive strength between the bus electrode and the wiring member, it is possible to dramatically improve the connection strength of the wiring portion of the solar battery string.

It is possible to use the electrically conductive adhesive composition according to the present embodiment also for connecting the electrode of a back-surface electrode type (back contact type) solar battery cell and a wiring member (a wiring substrate). In this case, the electrically conductive adhesive composition according to the present embodiment is first applied on the electrode of the wiring substrate or the back-surface electrode of the solar battery cell. Then, after an encapsulant which has been hollowed out such that the electrode portion of the wiring substrate (a portion applied with the electrically conductive adhesive composition) is exposed is laminated on the wiring substrate, a solar battery cell is arranged thereon such that the back-surface electrode of the solar battery cell and the electrode portion of the wiring substrate come in contact with each other via the electrically conductive adhesive composition. Additionally, after an encapsulant and a glass member are arranged on the light receiving surface of the solar battery cell, and an encapsulant and a back sheet are arranged on the back surface side of the solar battery cell, it is possible to perform connection and adhesion of the back-surface electrode of the solar battery cell and the electrode of the wiring substrate and encapsulation of the solar battery cell at one time by heat-pressure bonding the laminate. As the glass member and the encapsulant, it is possible to use those mentioned in the method for producing the aforementioned solar battery module.

EXAMPLES

Hereinbelow, the invention is described in further detail according to Examples, but the present invention is not intended to be limited to these Examples.

<Provision of an Electrically Conductive Adhesive>

The materials used in Examples and Comparative Examples are those prepared or those obtained in accordance with the following methods. The details of the method for preparing an electrically conductive adhesive are shown in Example 1. The resin compositions and the combination ratios of other Examples and Comparative Examples are as shown in Table 1 and Table 2, and as for the preparation method, it is the same as in Example 1.

Example 1

After 27.3 parts by mass of YL-980 (manufactured by Mitsubishi Chemical Corporation, a bisphenol A-type epoxy resin, product name) and 2.7 parts by mass of San-Aid SI-60L (SANSHIN CHEMICAL INDUSTRY CO., LTD., product name, a thermal cationic polymerization initiator) was mixed, an adhesive component was prepared by passing through triple-rolls three times.

Subsequently, after 70 parts by mass of Sn42-Bi58 solder particles (the average particle size 20 μm, manufactured by MITSUI MINING & SMELTING CO., LTD., the melting point 138° C.), which are electrically conductive particles, was added to 30 parts by mass of the adhesive component mentioned above, stirring was performed using a planetary mixer. Additionally, defoaming treatment was performed at 500 Pa or less for 10 minutes to thereby obtain an electrically conductive adhesive composition as an electrically conductive adhesive.

Examples 2 to 10 and Comparative Examples 1 to 7

Electrically conductive adhesive compositions of Examples 2 to 10 and Comparative Examples 1 to 7 were obtained as an electrically conductive adhesive as with in Example 1, except that the compositions were as in Table 1 and Table 2. The unit of the combination proportion for each material in Table 1 and Table 2 is parts by mass. The details of the components in Table 1 and Table 2 are as follows.

YDF-170: a bisphenol F-type epoxy resin, manufactured by Tohto Kasei Co., Ltd.

630LSD: an amine-type epoxy resin, manufactured by Mitsubishi Chemical Corporation San-Aid SI-80L: a thermal cationic polymerization initiator, manufactured by SANSHIN CHEMICAL INDUSTRY CO., LTD.

San-Aid SI-100L: a thermal cationic polymerization initiator, manufactured by SANSHIN CHEMICAL INDUSTRY CO., LTD.

2P4MHZ-PW: an imidazole compound, manufactured by SHIKOKU CHEMICALS CORPORATION

2PZ-CN: an imidazole compound, manufactured by SHIKOKU CHEMICALS CORPORATION

BHPA: 2,2-bis(hydroxymethyl)propionate

Sn42-Bi57-Ag1 solder particles: the average particle size 20 μm, manufactured by MITSUI MINING & SMELTING CO., LTD., the melting point 139° C.

Sn96.5-Ag3-Cu0.5 solder particles: the average particle size 20 μm, manufactured by MITSUI MINING & SMELTING CO., LTD., the melting point 217° C.

Sn99.3-Cu0.7 solder particles: the average particle size 20 μm, manufactured by MITSUI MINING & SMELTING CO., LTD., the melting point 227° C.

Comparative Examples 8 to 9

In Comparative Example 8, commercially available Sn42-Bi58 cream solder was used as an electrically conductive adhesive. In Comparative Example 9, a commercially available Ag paste was used as an electrically conductive adhesive. It should be noted that these electrically conductive adhesives do not contain a thermal cationic polymerization initiator.

<Evaluation of the Properties>

The properties of the electrically conductive adhesives of the above-described Examples and Comparative Examples were evaluated in accordance with the following method.

[Manufacturing of a Solar Battery String]

Examples 1 to 8 and Comparative Examples 1 to 9

Ten heterojunction solar battery cells (125 mm×125 mm, thickness 210 μm) were provided. Subsequently, after a liquid electrically conductive adhesive of Examples 1 to 8 and Comparative Examples 1 to 9 was printed on a surface electrode (material: silver paste, 2 mm×125 mm) formed on the light receiving surface of a heterojunction solar battery cell (125 mm×125 mm, thickness 210 μm) using a metal mask (thickness 100 μm, opening dimension 1.2 mm×125 mm), a solder-coated tab line (manufactured by Hitachi Cable, Ltd., product name: A-TPS) was arranged as a wiring member. A similar treatment was performed on the back-surface electrode of the solar battery cell and a solder-coated tab line was arranged. Then, setting was made such that the temperature at the portion to be heated reached 160° C. and heating was performed for 30 seconds using a hot-air heating connection device for solar batteries (manufactured by NPC Incorporated, product name: NTS-150-M) to thereby manufacture a 10-ganged solar battery string in which the surface electrode of the solar battery and the solder-coated tab line, and the back-surface electrode of the solar battery and the solder-coated tab line were each connected via the electrically conductive adhesive. The hot-air heating condition was changed to 160° C./10 seconds, 160° C./2 seconds, and 220° C./2 seconds, and solar battery strings were manufactured as described above.

Examples 9 to 10

Crystalline silicon solar battery cells were used instead of heterojunction solar battery cells, and also an electrically conductive adhesive of Examples 9 to 10 was used, to thereby manufacture a solar battery string as with in the manner described above.

[Evaluation of Connection Strength]

Connection strength of the connection portion was evaluated using a method in which only the solder-coated tab line portion of the solar battery string manufactured in accordance with the above-described method was held and pulled up perpendicularly to the horizontal surface of the solar battery string. The case where the solder-coated tab line and the solar battery string were not peeled off by the self weight at the time of pull-up was considered to maintain sufficient connection strength and evaluated as "A". The case where only end portions were peeled off by the self weight was evaluated as "B". The case where the solar battery string did not lift up and the tab line was completely peeled off from the connection portion by the self weight when the solder-coated tab line was pulled up was evaluated as "C". The results are shown in Table 1 and Table 2.

[Evaluation of the Metal Aggregation Condition]

The aggregation condition of the metal in the electrically conductive adhesive between the surface electrode of the solar battery string manufactured in accordance with the above-described method (except Comparative Example 2) and the wiring member was observed with an X-ray fluoroscopic apparatus (manufactured by SHIMADZU CORPORATION, Macro focus X-ray fluoroscopic apparatus SMX-1000) (see FIG. 4, which is observation photographs.). The case where the electrically conductive particles completely melted and aggregated was evaluated as "A", the case where there was engagement (biting) of the resin between melt metal paths was evaluated as "B", and the case where the electrically conductive particles did not melt and aggregate was evaluated as "C". In the case where the electrically conductive particles do not melt and aggregate (no aggregation), black granular metal particles are observed in an X-ray fluoroscopic apparatus image, as shown in FIG. 4. In the case where the electrically conductive particles melt and aggregate, black granular metal particles, which were seen in the time of no aggregation, are not observed, but bulk metal aggregation formed by melting of the electrically conductive particles is observed as a shadow across the entire surface. It should be noted that a difference in the conductivity is not observed in the cases of the complete melting "A" and the resin engagement "B" because the areas of the electrically conductive path are not substantially different. The results are shown in Table 1 and Table 2.

[Manufacturing of a Solar Battery Module]

With respect to the solar battery string manufactured in accordance with the above-described method, an encapsulating resin (manufactured by Mitsui Chemicals Fabro, Inc., product name: SOLAREVA SC50B) and a protective film (manufactured by KOBAYASHI & CO., LTD., product name: KOBATECH PV) were laminated on the back surface of the solar battery cells, and an encapsulating resin (manufactured by Mitsui Chemicals Fabro, Inc., product name: SOLAREVA SC50B) and a glass member (200×200×3 mm) were laminated on the surface of the solar battery cells (the light receiving surface) to thereby obtain a laminate. Subsequently, after the laminate was mounted such that the glass member came in contact with the hot-plate side of a vacuum laminator (manufactured by NPC Incorporated, product name: LM-50×50-S) and placed under a reduced pressure of 0.1 MPa for 5 minutes, heating at 140° C. for 10 minutes was performed in the condition where the vacuum of the vacuum laminator was released to thereby manufacture a solar battery module. In this case, the time taken to reach 140° C. was 8 minutes.

[A High-Temperature and High-Humidity Test]

The I-V curve of the solar battery module manufactured in accordance with the above-described method was measured with a solar simulator (manufactured by WACOM ELECTRIC CO., LTD., product name: WXS-155S-10, AM:1.5 G). After the solar battery module was left at rest under a high temperature and high humidity atmosphere of 85° C. and 85% RH for 1500 hours, the I-V curve was similarly measured. The curve factor (Fill Factor: hereinafter, abbreviated as "F. F"), which represents the electrical properties of the solar battery, was each derived from each I-V curve. The change ratio ΔF. F (=[F. F (1500 h)×100/F. F (0 h)], unit "%") between F. F (0 h) before being left at rest under the high-temperature and high-humidity atmosphere and F. F (1500 h) after being left at rest under the high-temperature and high-humidity atmosphere was calculated as an evaluation index. It should be noted that the connection reliability is determined to be good generally when the value of ΔF. F becomes 95% or more. The results are shown in Table 1 and Table 2.

TABLE 1

| | Items | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| Thermosetting resin | YL-980 | 27.3 | 27.3 | 27.3 | 24.6 | — | 27.3 | 26.0 | 23.3 | 27.3 | 27.3 |
| | YDF-170 | — | — | — | — | 27.3 | — | — | — | — | — |
| | 630LSD | — | — | — | — | — | — | — | — | — | — |
| Thermal cationic polymerization initiator | SI-60L | 2.7 | — | — | — | 2.7 | 2.7 | — | — | 2.7 | 2.7 |
| | SI-80L | — | 2.7 | — | — | — | — | 2.7 | — | — | — |
| | SI-100L | — | — | 2.7 | 5.4 | — | — | — | 5.4 | — | — |
| Curing promoter | 2P4MHZ-PW | — | — | — | — | — | — | — | — | — | — |
| | 2PZ-CN | — | — | — | — | — | — | — | — | — | — |
| Flux activator | BHPA | — | — | — | — | — | — | 1.3 | 1.3 | — | — |
| Electrically conductive particles | Sn42-Bi58 | 70 | 70 | 70 | 70 | 70 | — | 70 | 70 | 70 | — |
| | Sn42-Bi57-Ag1 | — | — | — | — | — | 70 | — | — | — | — |
| | Sn96.5-Ag3-Cu0.5 | — | — | — | — | — | — | — | — | — | 70 |
| | Sn99.3-Cu0.7 | — | — | — | — | — | — | — | — | — | — |
| Electrically conductive adhesive | Sn42-Bi58 cream solder | — | — | — | — | — | — | — | — | — | — |
| | Ag paste | — | — | — | — | — | — | — | — | — | — |
| Solar battery cell | | Heterojunction | | | | | | | | | Crystalline silicon |
| Connection condition 160° C./30 seconds | Connection strength evaluation | A | A | A | A | A | A | A | A | A | A |
| | Metal aggregation condition evaluation | A | A | A | A | A | A | A | A | A | C |
| | ΔF. F (%) | 98.5 | 98.5 | 98.4 | 98.5 | 98.5 | 98.3 | 98.4 | 98.5 | 98.7 | 81.5 |
| Connection condition 160° C./10 seconds | Connection strength evaluation | A | A | A | A | A | A | A | A | A | A |
| | Metal aggregation condition evaluation | A | A | B | A | A | A | A | A | A | C |
| Connection condition 160° C./2 seconds | Connection strength evaluation | A | A | B | A | A | A | A | A | A | A |
| | Metal aggregation condition evaluation | A | B | B | A | A | A | A | A | A | C |
| Connection evaluation 220° C./2 seconds | Connection strength condition | A | A | A | A | A | A | A | A | A | A |
| | Metal aggregation condition evaluation | A | A | A | A | A | A | A | A | A | A |
| | ΔF. F (%) | 98.4 | 98.1 | 98.1 | 98.4 | 98.3 | 98.2 | 98.3 | 98.4 | 98.6 | 98.4 |

TABLE 2

| Items | | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 |
|---|---|---|---|---|---|---|---|---|---|---|
| Thermosetting resin | YL-980 | 27.3 | 27.3 | 27.3 | 27.3 | 27.3 | 26.0 | — | — | — |
| | YDF-170 | — | — | — | — | — | — | — | — | — |
| | 630LSD | — | — | — | — | — | — | 25.2 | — | — |
| Thermal cationic polymerization initiator | SI-60L | — | 2.7 | 2.7 | — | — | — | — | — | — |
| | SI-80L | — | — | — | — | — | — | — | — | — |
| | SI-100L | — | — | — | — | — | — | — | — | — |
| Curing promoter | 2P4M1-IZ-PW | — | — | — | 2.7 | — | 2.7 | — | — | — |
| | 2PZ-CN | — | — | — | — | — | — | 1.3 | — | — |
| Flux activator | BHPA | — | — | — | — | 2.7 | 1.3 | 1.5 | — | — |
| Electrically conductive particles | Sn42-Bi58 | 70 | — | — | 70 | 70 | 70 | 70 | — | — |
| | Sn42-Bi57-Ag1 | — | — | — | — | — | — | — | — | — |
| | Sn96.5-Ag3-Cu0.5 | — | — | — | — | — | — | — | — | — |
| | Sn99.3-Cu0.7 | — | — | 70 | — | — | — | — | — | — |
| Electrically conductive adhesive | Sn42-Bi58 cream solder | — | — | — | — | — | — | — | 100 | — |
| | Ag paste | — | — | — | — | — | — | — | — | 100 |
| Solar battery cell | | Heterojunction | | | | | | | | |
| Connection condition 160° C./30 seconds | Connection strength evaluation | C | A | A | C | C | C | C | C | B |
| | Metal aggregation condition evaluation | C | — | C | C | A | A | A | A | C |
| | ΔF. F (%) | 80.5 | 80.5 | 83.5 | 83.4 | 84.0 | 92.6 | 92.0 | 83.5 | 90.1 |
| Connection condition 160° C./10 seconds | Connection strength evaluation | C | A | A | C | C | C | C | C | B |
| | Metal aggregation condition evaluation | C | — | C | C | A | A | A | A | C |
| Connection evaluation condition 160° C./2 seconds | Connection strength evaluation | C | A | A | C | C | C | C | C | B |
| | Metal aggregation condition evaluation | C | — | C | C | A | A | A | A | C |
| Connection condition 220° C./2 seconds | Connection strength evaluation | C | A | A | C | C | C | C | C | B |
| | Metal aggregation condition evaluation | C | — | C | C | A | A | A | A | C |
| | ΔF. F (%) | 80.0 | 79.5 | 82.5 | 82.4 | 83.5 | 92.0 | 91.4 | 82.4 | 89.2 |

It was confirmed that all of Examples 1 to 10 exhibited connection strength, a metal aggregation condition, and ΔF. F (%), which were good, in the heating connection at 220° C., good connection strength was obtained in the connection under the conditions of low-temperature and short-time, and good connection reliability was obtained in the high-temperature and high-humidity test. Additionally, all of Examples 1 to 9 exhibited connection strength, a metal aggregation condition, and ΔF. F (%), which were good, even in the heating connection at 160° C.

In Comparative Examples 1 to 4, metal particles did not melt, and the connection strength was also reduced. In Comparative Examples 2 and 3, the connection strength was good, but ΔF. F (%) was reduced, and thus, it was confirmed that there was a problem in the connectivity. The connection strength was reduced in all of Comparative Examples 5 to 8, but with respect to Comparative Examples 6 and 7, ΔF. F (%) exhibited was a relatively good value. This is an influence of progress in curing of the thermosetting resin in the laminating step. In Comparative Example 9, the connection strength was relatively good, but ΔF. F (%) was reduced, and thus it was confirmed that there was a problem in the connectivity.

What is claimed is:

1. An electrically conductive adhesive composition, comprising:
   electrically conductive particles containing a metal of which melting point is 220° C. or less;
   a thermosetting resin; and
   a thermal cationic polymerization initiator,
   wherein a combination ratio of the content of components of the electrically conductive adhesive composition other than the electrically conductive particles to the content of the electrically conductive particles is 5/95 to 50/50 in terms of the solid content ratio by mass.

2. The electrically conductive adhesive composition according to claim 1, wherein the metal of the electrically conductive particles contains at least one selected from the group consisting of bismuth, indium, tin, and zinc.

3. The electrically conductive adhesive composition according to claim 1, further comprising a flux activator.

4. The electrically conductive adhesive composition according to claim 3, wherein the flux activator has a hydroxyl group and a carboxyl group.

5. The electrically conductive adhesive composition according to claim 1, wherein the thermosetting resin contains an epoxy resin.

6. The electrically conductive adhesive composition according to claim 1, wherein the thermal cationic polymerization initiator releases at least one selected from the group consisting of an inorganic ion containing an antimony atom, an inorganic acid ion containing a phosphorus atom, and an organic acid ion containing a boron atom, by heating.

7. The electrically conductive adhesive composition according to claim 1, wherein a reaction start temperature of the thermosetting resin and the thermal cationic polymerization initiator is from 30 to 200° C.

8. The electrically conductive adhesive composition according to claim 1 used for electrically connecting an electrode of a solar battery cell and a wiring member.

9. The electrically conductive adhesive composition according to claim 1, wherein the combination ratio of the content of components of the electrically conductive adhesive composition other than the electrically conductive particles to the content of the electrically conductive particles is 30/70 or less in terms of the solid content ratio by mass.

10. The electrically conductive adhesive composition according to claim 1, wherein the combination ratio of the content of components of the electrically conductive adhesive composition other than the electrically conductive particles to the content of the electrically conductive particles is 10/90 to 30/70 in terms of the solid content ratio by mass.

11. The electrically conductive adhesive composition according to claim 1, wherein the content of the thermosetting resin in the electrically conductive adhesive composition is 40% by mass or less.

12. The electrically conductive adhesive composition according to claim 1, wherein the thermal cationic polymerization initiator comprises at least one salt selected from the group consisting of sulfonium salts, thiophenium salts, thiolanium salts, benzylanimonium salts, pyridinium salts, hydrazinium salts, carboxylic acid esters, sulfonic acid esters, amine imides, diazonium salts, iodonium salts, and phosphonium salts.

13. The electrically conductive adhesive composition according to claim 1, wherein the content of the thermal cationic polymerization initiator is 0.01 parts by mass or more and more relative to 100 parts by mass of the thermosetting resin.

14. The electrically conductive adhesive composition according to claim 1, wherein the content of the thermal cationic polymerization initiator is 0.1 parts by mass or more and more relative to 100 parts by mass of the thermosetting resin.

15. A connection structure, comprising:
a solar battery cell, and
a wiring member electrically connected with an electrode of the solar battery cell via the electrically conductive adhesive composition according to claim 1 or a cured product thereof.

16. A method for producing a solar battery module, comprising:
a step of arranging an electrode of a solar battery cell and a wiring member so as to face each other via the electrically conductive adhesive composition according to claim 1;
a step of laminating encapsulants on a light receiving surface side of the solar battery cell and on a back surface side opposite to the light receiving surface;
a step of laminating a glass member on the encapsulant at the light receiving surface side of the solar battery cell;
a step of laminating a protective film on the encapsulant at the back surface side of the solar battery cell; and
a step of heating the laminate having the glass member and the protective film to electrically connect the electrode of the solar battery cell and the wiring member and also to encapsulate the solar battery cell.

17. A solar battery module, comprising:
a solar battery cell;
a wiring member electrically connected to an electrode of the solar battery cell via the electrically conductive adhesive composition according to claim 1 or a cured product thereof;
encapsulants laminated each on a light receiving surface side of the solar battery cell and a back surface side opposite to the light receiving surface;
a glass member laminated on the encapsulant at the light receiving surface side of the solar battery cell; and
a protective film laminated on the encapsulant at the back surface side of the solar battery cell.

* * * * *